United States Patent
Asada et al.

(10) Patent No.: US 7,412,895 B2
(45) Date of Patent: Aug. 19, 2008

(54) SEMICONDUCTOR PRESSURE SENSOR AND DIE FOR MOLDING A SEMICONDUCTOR PRESSURE SENSOR

(75) Inventors: Shinsuke Asada, Tokyo (JP); Hiroshi Nakamura, Tokyo (JP); Masaaki Taruya, Tokyo (JP)

(73) Assignee: Mitsubishi Electric Corp., Tokyo (JP)

( * ) Notice: Subject to any disclaimer, the term of this patent is extended or adjusted under 35 U.S.C. 154(b) by 10 days.

(21) Appl. No.: 11/507,461

(22) Filed: Sep. 22, 2006

(65) Prior Publication Data

US 2007/0193359 A1   Aug. 23, 2007

(30) Foreign Application Priority Data

Feb. 20, 2006   (JP) .......................... P2006-042668

(51) Int. Cl.
*G01L 9/00* (2006.01)
(52) U.S. Cl. .............................. 73/753; 73/754; 73/706
(58) Field of Classification Search ........... 73/700–756; 361/283.1–283.4
See application file for complete search history.

(56) References Cited

U.S. PATENT DOCUMENTS

| | | | | |
|---|---|---|---|---|
| 5,900,554 A * | 5/1999 | Baba et al. ..................... 73/725 | | |
| 5,948,991 A | 9/1999 | Nomura et al. | | |
| 6,521,966 B1 * | 2/2003 | Ishio et al. ................... 257/417 | | |
| 6,601,453 B2 * | 8/2003 | Miyazaki et al. .............. 73/754 | | |
| 6,615,669 B1 | 9/2003 | Nishimura et al. | | |
| 6,718,829 B2 * | 4/2004 | Baba et al. ..................... 73/754 | | |
| 6,807,864 B2 * | 10/2004 | Takakuwa et al. ............. 73/706 | | |
| 6,951,136 B2 * | 10/2005 | Kato ........................... 73/754 | | |
| 6,955,091 B2 * | 10/2005 | Fujimoto et al. .............. 73/756 | | |
| 6,964,200 B2 * | 11/2005 | Miyazaki et al. ............... 73/754 | | |
| 7,043,993 B2 * | 5/2006 | Hayashi et al. ................ 73/708 | | |
| 7,055,391 B2 * | 6/2006 | Tokuhara ..................... 73/700 | | |
| 7,216,546 B2 * | 5/2007 | Hayashi et al. ................ 73/708 | | |
| 7,260,992 B2 * | 8/2007 | Hayashi et al. ................ 73/700 | | |
| 2005/0115328 A1 | 6/2005 | Hayashi et al. | | |

FOREIGN PATENT DOCUMENTS

| | | |
|---|---|---|
| JP | 10-170380 A | 6/1998 |
| JP | 2000-337987 A | 12/2000 |
| WO | 02/079743 A1 | 10/2002 |
| WO | 03/062779 A1 | 7/2003 |
| WO | WO 03/062779 A1 | 7/2003 |

* cited by examiner

*Primary Examiner*—Andre J. Allen
*Assistant Examiner*—Jermaine Jenkins
(74) *Attorney, Agent, or Firm*—Sughrue Mion, PLLC

(57) ABSTRACT

A semiconductor pressure sensor is provided with a semiconductor pressure sensor part that converts a pressure to an electrical signal, a sensor module in which said semiconductor pressure sensor part and a terminal of which part is extended to the outside are insert-molded with a first resin, and an outer case in which said sensor module is contained, and said sensor module is further insert-molded with a second resin to form a connector portion, and the semiconductor pressure sensor is characterized in that the exposed portion of the sensor module from the second resin, and the boundary between the exposed portion of the sensor module and the second resin are covered with an adhesive.

8 Claims, 4 Drawing Sheets

SEMICONDUCTOR PRESSURE SENSOR AND DIE FOR MOLDING A SEMICONDUCTOR PRESSURE SENSOR

FIELD OF THE INVENTION

The present invention relates to a semiconductor pressure sensor and, more particularly, a semiconductor pressure sensor improved in its hermetic sealing characteristics.

DESCRIPTION OF THE RELATED ART

The conventional semiconductor pressure sensor, for example, a semiconductor pressure sensor for use in measuring an intake pressure of automobile engines having such a construction as shown in the Japanese Patent Publication (unexamined) No. 337987/2000 (Patent Document 1) or the Japanese Patent Publication No. 170380/1998, is well known.

FIG. 8 shows the cross sectional construction of a semiconductor pressure sensor shown in Patent Document 1, and hereinafter will be described. In the drawing, an outer case 1 consists of a mounting portion 1a and a connector portion 1b. A terminal 2 for external connection is insert-molded so that a part thereof protrudes to the outside. The portion 1a includes a concave opening 4 open downward in the drawing, and a sensor module 3 is contained therein. Signals are output to the outside by welding together a lead frame 5 that derives from the above-mentioned sensor module 3 and the terminal 2.

Furthermore, a semiconductor pressure sensor part 6 and a signal processing part 7 are mounted onto the above-mentioned sensor module 3, and the electrical connection between internal elements or an IC chip, and the above-mentioned lead frame 5 case 1, and a leak path that gets trough the gap to be connected to the exposed portion is made. Consequently, a measured gas is leaked from a pressure introduction chamber, resulting in the problem that the accurate measurement of pressures comes to be impossible.

SUMMARY OF THE INVENTION

The present invention was made to address such problems, and provides a semiconductor pressure sensor avoiding problems of the fault in air-tightness or the corrosion of a lead to be improved in reliability of sealing properties in a semiconductor pressure sensor having the structure in which a sensor module in which a semiconductor pressure sensor part is contained is integrally molded in an outer case.

A semiconductor pressure sensor according to the invention comprises: a semiconductor pressure sensor part that converts a pressure to an electrical signal; a sensor module in which this semiconductor pressure sensor part and a terminal of which part is extended to the outside are insert-molded with a first resin; and an outer case in which mentioned sensor module is contained, and mentioned sensor module is further insert-molded with a second resin to form a connector portion, and the semiconductor pressure sensor is characterized in that the exposed portion of the sensor module from the second resin, and the boundary between the exposed portion of the sensor module and the second resin are covered with an adhesive.

According to the invention, due to the above-mentioned construction, the boundary between the case and the second resin, being a infiltration path of moisture and gas is sealed with is made by e.g., wire bonding, not shown. Whereas, there is provided a funnel-shaped lid 9 including a port 8 so as to cover the exposed space of the above-mentioned sensor module 3. A pressure transmission hole 8a is formed in the port 8, and intake air of an engine is introduced through this pressure transmission hole 8a to measure its pressure. There is provided a convex part 10 at the peripheral portion of the above-mentioned concave opening 4; and there is provided a concave part 11 at the above-mentioned lid 9 opposite to this convex part 10 so that the above-mentioned convex part 10 is contained therein. Hermetic sealing is achieved by putting an adhesive 12 in the gap between both of them.

However, in the above-described construction, the terminal 2 and the lead frame 5 have to be connected by e.g., resistance welding in the state in which the sensor module 3 is contained in the concave opening 4 of the outer case 1, and the concave opening 4 of the outer case 1 has to have an area where double poles of positive and negative welding electrodes can be in contact at this time. Therefore, the concave opening 4 is required to be of the next larger size of opening area with respect to the size of the sensor module 3. Moreover, since it is necessary that there is provided a mating portion in which the lid 9 and the outer case 1 are bonded and fixed at the peripheral portion of the above-mentioned concave opening 4, as a result, a semiconductor pressure sensor of the present construction comes to be markedly large-sized with respect to the sensor module 3.

On the other hand, proposed is a semiconductor pressure sensor of an integral mold structure in which a sensor module 3 that is insert-molded so that a part of a terminal 2 for external connection protrudes to the outside is further insert-molded to form an outer case 1. In this type of device, there is provided the mating portion between the outer case 1 and the lid 9 in the vicinity of the sensor module 3 therearound, thus enabling to obtain a smaller-sized semiconductor pressure sensor than that of the conventional construction.

However, in such an integral mold structure, a problem exits in that a minute gap is formed between the sensor module 3 and the outer case 1. Thus, the infiltration of air and moisture, being a pressure medium having been contaminated along this gap occurs to be the cause of the corrosion of metals in an internal part, the leakage of measured gas, or the like. This gap is made in the process of being cooled from at a molding temperature to an actual-use temperature due to the difference between coefficients of linear expansion of a molding material of a sensor module 3 and a molding material of an outer case 1 in which the sensor module 3 is insert-molded.

Furthermore, a sensor module 3 needs to be exposed from the outer case 1 at least at a point where a semiconductor pressure sensor part 6 is mounted, and at a terminal 2. The insert mold of a sensor module 3 is generally formed by injection molding of a thermoplastic resin, and there are some cases in which a minute gap is made between the sensor module 3 and a metal member such as terminal that is exposed to the outside due to the volume shrinkage that occurs at the time of solidification of resin. Accordingly, in the case where moisture is infiltrated along the gap made at this exposed portion, there is the fear of the corrosion of a metal lead frame 5 that is contained in the outer an adhesive, so that it is possible to prevent the corrosion of a lead due to the infiltration of moisture, and the fault in air-tightness due to the infiltration of gas, thus enabling to obtain a highly reliable semiconductor pressure sensor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
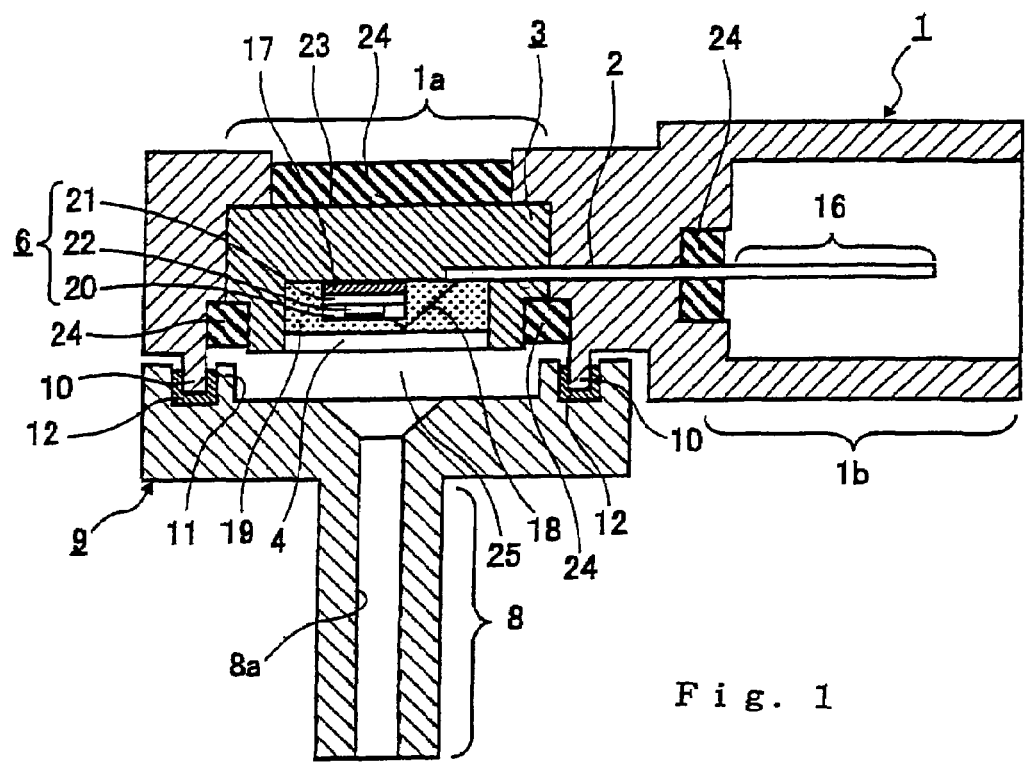
FIG. 1 is a cross sectional view showing the construction of a semiconductor pressure sensor according to a first preferred embodiment of the present invention.
Figure 2:
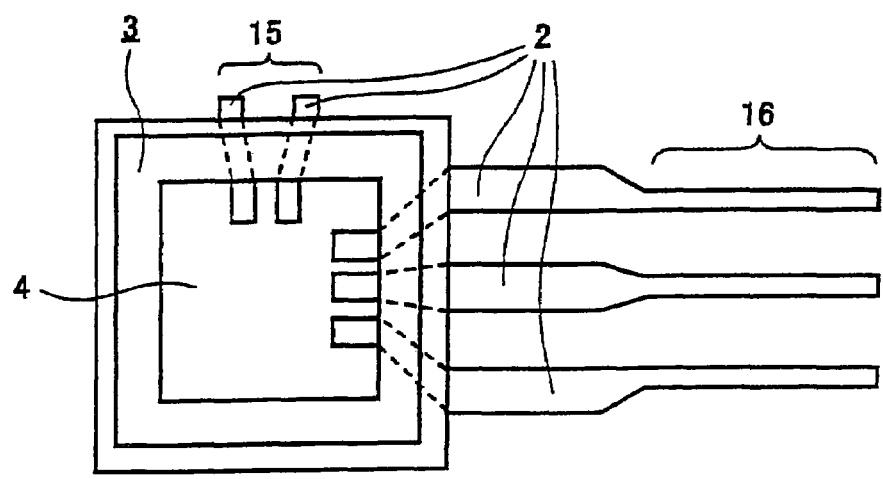
FIG. 2 is a front elevation of a sensor module to be integrated into the above-mentioned semiconductor pressure sensor according to the first embodiment.
Figure 8:
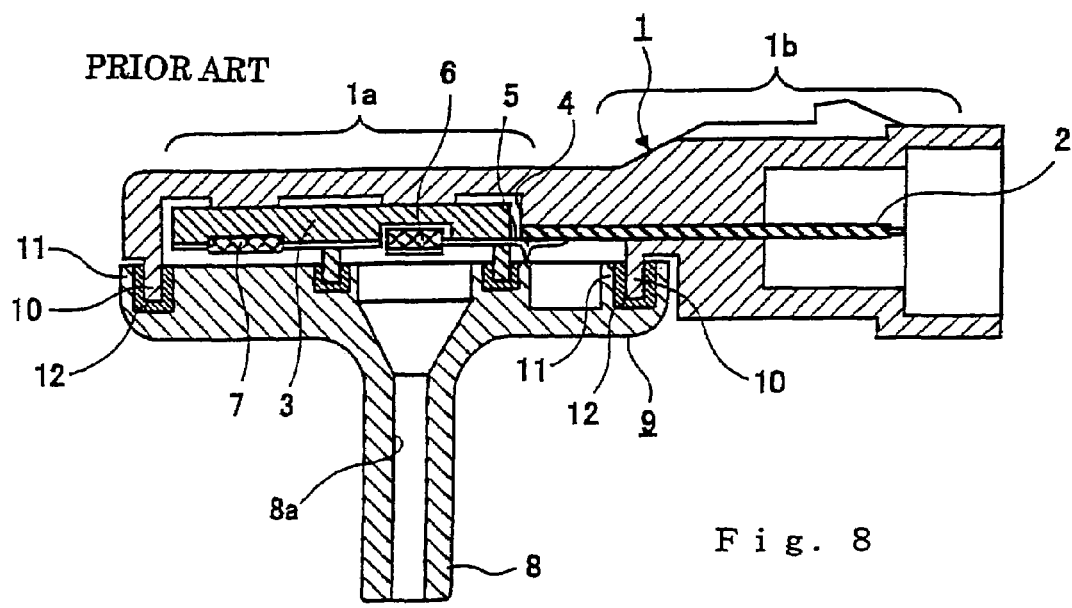
FIG. 8 is a cross sectional view showing the construction of a semiconductor pressure sensor according to the conventional art.

Hereinafter, a first preferred embodiment according to the present invention is described referring to FIG. 1 and FIG. 2. FIG. 1 is a cross sectional view showing the construction of a semiconductor pressure sensor according to the first embodiment. FIG. 2 is a front elevation of a sensor module 3. In the drawings, like reference numerals refer to the same or corresponding parts as those of FIG. 8 described in the conventional art.

In the sensor module 3 according to this first embodiment, a terminal 2 is made by molding a first resin, being a thermosetting resin, for example, an epoxy resin by the method of transfer molding. The sensor module 3 is provided with a concave opening 4 for mounting a semiconductor pressure sensor part 6. The terminal 2 is insert-molded such that one end is exposed in the concave opening 4, and the other end is exposed outside (on the right side in the drawing) the concave opening 4. As shown in FIG. 2, a part of the terminals 2 exposed outside the concave opening 4 are the below-described characteristic adjustment terminals 15, and a part thereof are connector terminals 16 at the time of being molded integrally with an outer case 1.

The semiconductor pressure sensor part 6 is die-bonded to the bottom of the above-mentioned opening 4 via a die bond material 17, for example, of fluorine group, and is electrically connected to the terminals 2 exposed in the concave opening 4 through a bonding wire 18 made of gold or aluminum. The semiconductor pressure sensor part 6, the terminals 2, and the bonding wire 18 in an internal part of the concave opening 4 are coated with a protective resin layer 19, for example, a fluorine gel in order to prevent the corrosion caused by a measured gas, and to ensure electrical insulating properties. This protective resin layer 19 so soft as not to interfere with the pressure detection operation of a pressure sensor, is selected.

A semiconductor sensor part 6 utilizing the piezo resistance effect is known, and this semiconductor sensor part 6 is constructed of a silicon chip 22 including a diaphragm, and a glass pedestal 21 joined to this silicon chip 22 with a field assisted bonding. There are formed a vacuum chamber 20 under the diaphragm by joining the above-mentioned silicon chip 22 and glass pedestal 21. Pressures are output as sensor signals by detecting strains of the diaphragm generated due to the difference between the pressure of a measured gas and the pressure in the vacuum chamber 20 from the change of resistance values of a gage resistor that is formed on this diaphragm as out-of-balance states of a bridge circuit.

Furthermore, in the semiconductor pressure sensor part 6, there are formed at points other than the pressure sensing device including a diaphragm an amplifier circuit that amplifies electrical signals from the pressure sensing device, not shown, an adjustment circuit that makes the adjustment to desired output voltage characteristics, a ROM in which adjusted data are stored, or the like. The characteristic adjustment is made by electrical signals being input from the outside via the adjustment terminals 15. The outer case 1 is formed by molding the above-mentioned sensor module 3 as an integral part using a second resin, being a thermoplastic resin, for example, PBT (polybutylene terephthalate) or PPS (polyphenylene sulfide)) by injection molding.

There is formed at the outer case 1 a convex part 10 causing a connector portion 1b for external connection and a port 8 for pressure introduction to be joined by bonding. Sealing is made with an adhesive 12 between this convex part 10 and a concave part 11 that is formed at the opposite portion of a lid 9. Besides, in the outer case 1, there are exposed portions from the second resin at three points of a connector terminal part 16 of the terminals 2, a semiconductor pressure sensor mounting portion 1a, and a back face 23 of the sensor module 3. In addition, the exposure at the back face 23 in the outer case 1 is made as a result of holding the case sandwiched between the upper die and the lower die of molding dies so as to prevent the outer case 1 from being out of position when it is integrally molded.

According to the first embodiment, portions of the sensor module 3 exposed from the above-mentioned outer case 1, including the boundary between the outer case 1 and the sensor module 3, are covered with an adhesive 24. This adhesive 24 employs an epoxy adhesive or material such as rubber of silicon resin. Further, desirably a groove in which the adhesive 24 can be put may be formed at the above-mentioned boundary as shown. Like this, at least the boundary between the outer case 1 and the sensor module 3 which may be an infiltration path of moisture or gas is sealed with an adhesive. Consequently, it is possible to effectively prevent the corrosion of leads due to the infiltration of moisture, or the fault in air-tightness due to the infiltration of gas as described above, thus enabling to obtain a highly reliable semiconductor pressure sensor.

In addition, the outer case 1 and the lid 9 are bonded and secured through an adhesive 12 at the mating portion, and a pressure introduction chamber 25 is formed in an internal part thereof. Since the adhesive 12 differs from the above-described adhesive 24 for sealing at the boundary, and requires the mechanical strength, desirably it may be an epoxy adhesive of higher hardness than rubber-like one. Incidentally, according to this first embodiment, the first resin that forms the sensor module 3 employs a thermosetting resin; and the second resin that forms the outer case 1 employs a thermoplastic resin, and the reasons thereof are as follows.

That is, although there are minute gaps at the interface portions between the outer case 1 and the sensor module 3 as described above, these gaps can be filled without residual air bubbles by the use of a thermosetting resin as the first resin with which good adhesion properties with respect to metals can generally be obtained. Therefore, it is possible to prevent gas that remains in the resin from going through the interface between the first resin that forms the sensor module 3 and the terminals 2 to leak into the concave opening 4, and causing the damage of the protective resin layer 19. However, on the other hand, as material of the outer case 1 including the complicated structure such as a connector part 16, a thermoplastic resin having high moldability is used. Consequently, properties of both of these resins are effectively exhibited, thus making it possible to obtain a pressure sensor achieving both high reliability and productivity.

Embodiment 2

Figure 3:
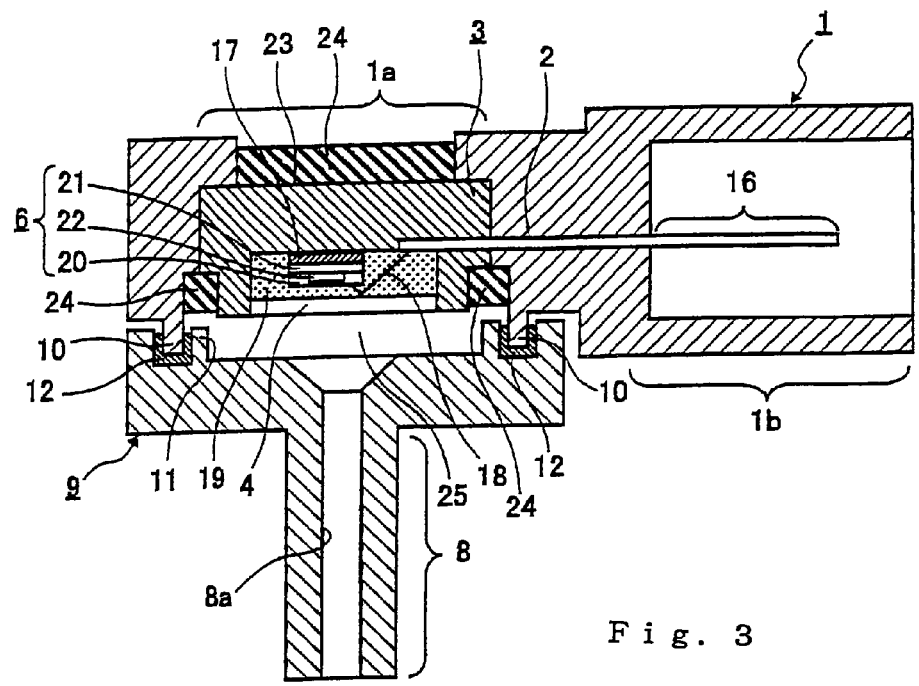
FIG. 3 is a cross sectional view showing the construction of a semiconductor pressure sensor according to a second embodiment of the invention.

Now, a second embodiment according to the invention is described referring to FIG. 3. FIG. 3 shows the cross section of a semiconductor pressure sensor according to the second embodiment. Further, like reference numerals refer to the same parts as those of FIGS. 1 and 2. The point different from the first embodiment is that sealing with an adhesive 24 at the boundary between the connector terminal 16, being a part of the sensor module 3 that is exposed in an internal part of the connector portion 1b, and the second resin that forms the outer case 1, is omitted.

As described in the first embodiment, shown is an example in which there are parts exposed from the second resin at three points of the connector terminal part 16 of the terminals 2, the semiconductor pressure sensor mounting portion 1a, and the back portion 23 of the sensor module 3 in the outer case 1. According to the second embodiment, it is shown that sealing at the connector terminal part 16 of the terminals 2 can be omitted in the case where the connector portion 1b includes a waterproof function. The connector portion including the waterproof function refers to a connector of type of the exposed portions of a male metal terminal and a female metal terminal being achieved to be waterproof in the state in which the connector terminal part 16 is mounted onto the other connector (not shown) at the time of use.

In the case of a connector according to this second embodiment, rubber packing is attached to a female connector to be mated, and waterproof sealing is achieved by this mounting. By the use of a connector including the waterproof function, there is no concern for the infiltration of water in practical use. Furthermore, since the boundary between the first resin that forms the sensor module 3 other than that in an internal part of the connector, and the second resin that forms the outer case 1 is sealed with the adhesive 24, there is no fear of leading to leakage even if gas is infiltrated. According to this second embodiment, since the boundary to which an adhesive 24 is applied between the sensor module 3 and the second resin to which junctions an adhesive 24 is applied can be reduced, an advantage exists in that the manufacturing process can be simplified as compared with the first embodiment.

Embodiment 3

Figure 4:
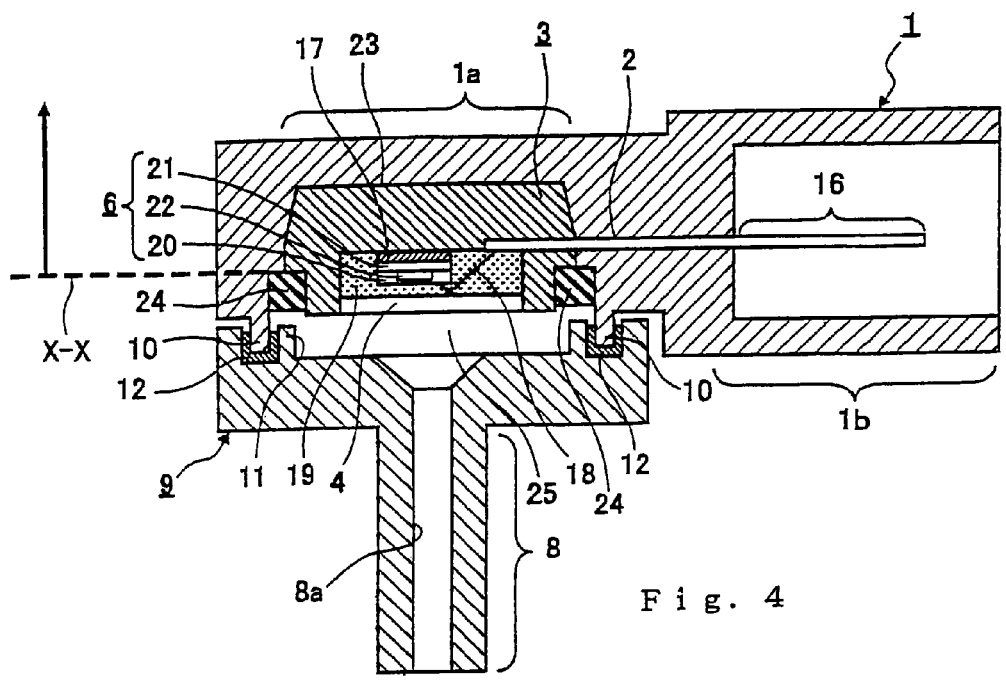
FIG. 4 is a cross sectional view showing the construction of a semiconductor pressure sensor according to a third embodiment of the invention.

Now, a third embodiment is described. FIG. 4 shows the cross section of a semiconductor pressure sensor according to the third embodiment. Further, like reference numerals refer to the same or corresponding parts to those of FIGS. 1 through 3. According to this third embodiment, shown is a semiconductor pressure sensor in which there is further no exposed portion of the sensor module 3 even at the back face 23 of the sensor module 3. Accordingly, according to this third embodiment, the point at which the sensor module 3 is exposed from the second resin other than in an internal part of the connector terminal 16 is only the point including the mounting portion 1a of a semiconductor pressure sensor part 6, thus enabling further simplification of the manufacturing process to be expected.

To embody such an outer case 1, some way in the method of fixing the sensor module 3 when being injection-molded with the second resin may be devised. That is, since the sensor module 3 cannot be secured with upper and lower dies at the time of molding as in the first embodiment, there is the risk that the displacement of a sensor module 3 occurs, or the second resin runs over to the exposed portion accompanied by the flow of the second resin in the dies. To prevent these events, there is provided a gate 26, being a resin injection spout when molding the second resin (refer to FIG. 5) on the more backside of the sensor module 3 than a plane X-X getting through the boundary between the exposed portion of the sensor module including the mounting portion 1a of the semiconductor pressure sensor part. 6 and the second resin.

Figure 5:
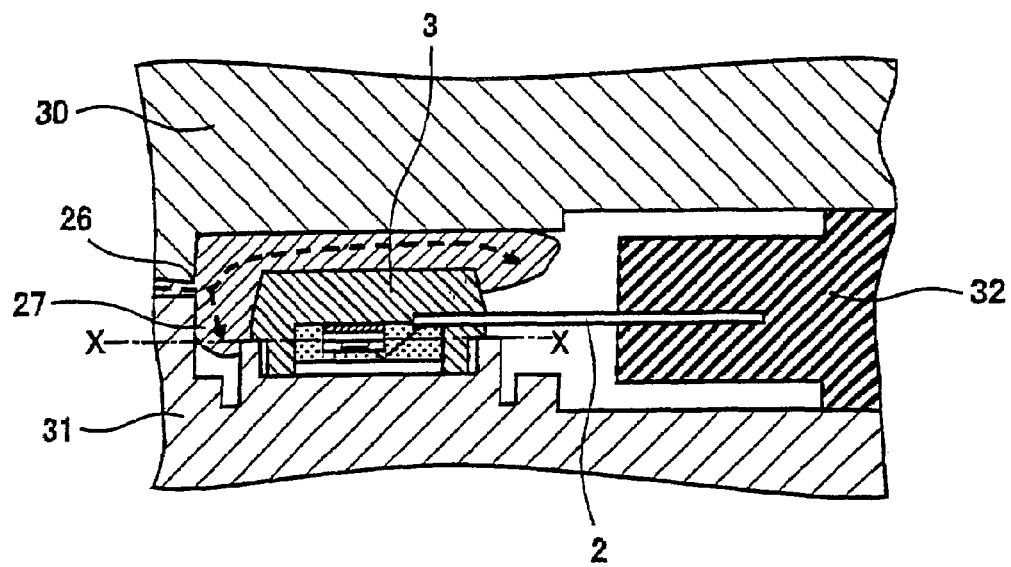
FIG. 5 is a view showing the molding state with dies according to the above-mentioned third embodiment.

FIG. 5 is a view showing the molding state using dies. In the drawing, reference numeral 30 designates an upper die, numeral 31 a lower die, and numeral 32 a loose piece. The sensor module 3 is mounted on the lower die 31 in the state in which an end portion of the terminals 2 of the sensor module 3 is inserted and held in the loose piece 32, and is closed with the upper die 30 from above. When the second resin 27 is injected from the gate that is formed at the upper portion than the plane X-X as described above (on the backside of the sensor module 3), this second resin beings to be put in preferentially from the backside of the sensor module 3. Therefore, the sensor module 3 is pressed to the die 32 all the times due to injection pressure, and secured until the completion of flow of resin. Accordingly, there is no fear that a sensor module 3 is out of position, or the second resin is infiltrated into the exposed portion. At this time, due to the fact that there is provided taper of the breadth of the sensor module 3 being reduced toward the back face thereof, the effect of the sensor module 3 being pressed to the die comes to be higher.

Embodiment 4

Figure 6:
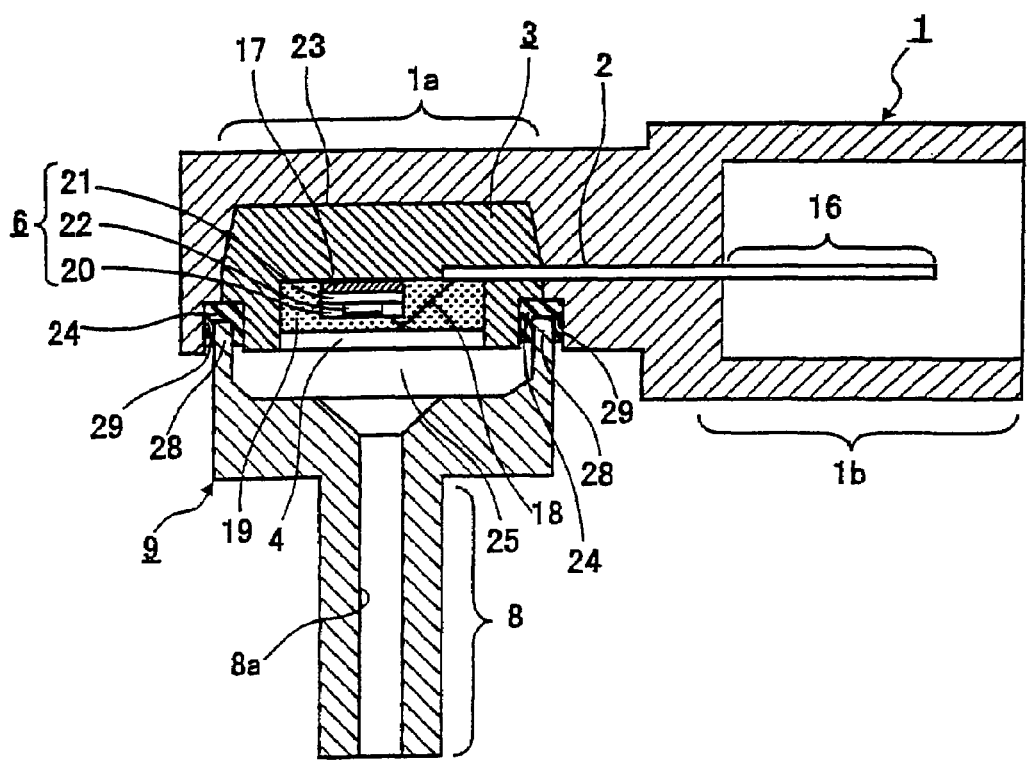
FIG. 6 is a cross sectional view showing the construction of a semiconductor pressure sensor according to a fourth embodiment of the invention.

Now, a fourth embodiment is described. FIG. 6 shows the cross section of a semiconductor pressure sensor according to the fourth embodiment. Furthermore, like reference numerals refer to the same parts as those of FIGS. 1 through 4. According to this fourth embodiment, there is provided at the lid 9 a convex part 28. This convex part 28 is inserted in a groove 29 that is formed at the boundary between the outer case 1 and the sensor module 3, and an adhesive 2 is put in between these convex part and groove to be sealed. As the adhesive 24, material of epoxy adhesive or rubber of silicon resin is employed.

According to this fourth embodiment, it is possible to make the sealing at the boundary between a sensor module 3 and the second resin 1, as well as to achieve joining of the lid including a pressure transmission hole 8a. Consequently, it is possible to simplify the manufacturing process, and additionally to achieve downsizing since the groove for sealing can be used as a bonding and mating portion as well.

Embodiment 5

Figure 7:
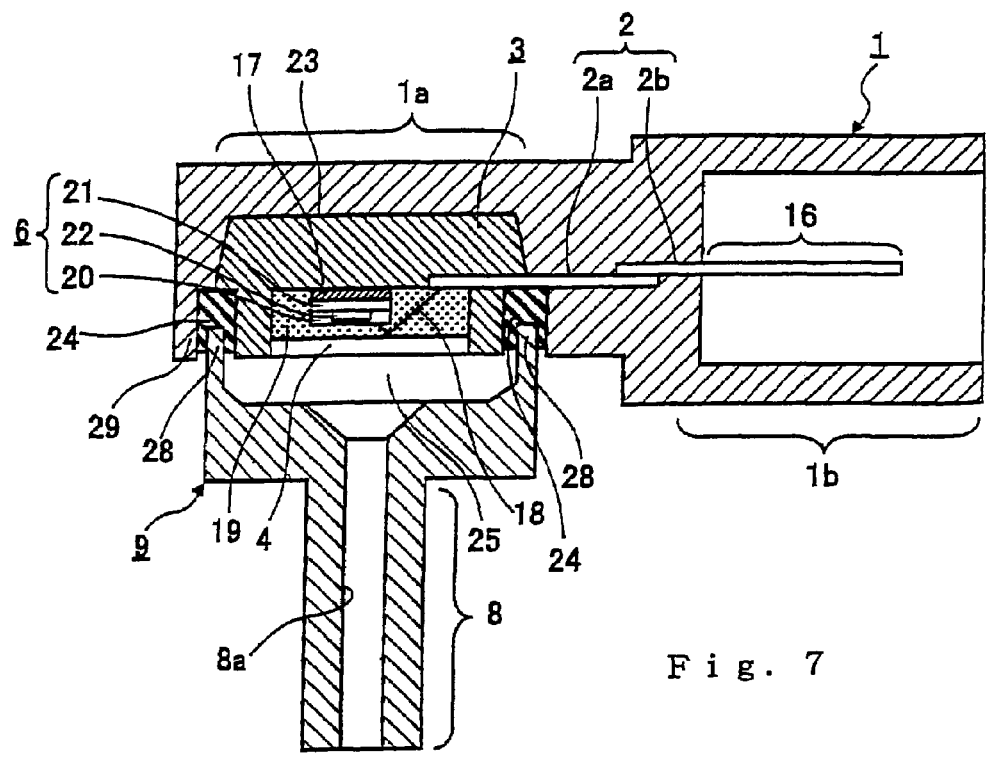
FIG. 7 is a cross sectional view showing the construction of a semiconductor pressure sensor according to a fifth embodiment of the invention.

Now, a fifth embodiment is described. FIG. 7 shows the cross section of a semiconductor pressure sensor according to the fifth embodiment. Furthermore, like reference numerals refer to the same parts as those of FIGS. 1 through 5. According to this fifth embodiment, a terminal 2 has an integrated construction of a lead 2a, which is insert-molded into the first resin that forms the sensor module 3, and a lead 2b which one end is a connector terminal 16 by bonding such as resistance welding.

According to the fifth embodiment, when a semiconductor pressure sensor which connector terminal has a plurality of configuration variations is manufactured, only a lead part including a connector terminal part is made to offer variations, and a sensor module 3 can be used as a common part, thereby enabling to simplify the manufacturing process.

In addition, although the semiconductor pressure sensors according to the first to fifth embodiments are described to be of piezoresistance effect type, it is preferable to be a semiconductor pressure sensor utilizing the other measurement principles such as electrical capacitance type. Furthermore, although a pressure sensing part and a signal processing circuit are formed on the same chip, it is preferable that both of them are formed on different chips.

While the presently preferred embodiments of the present invention have been shown and described. It is to be understood that these disclosures are for the purpose of illustration and that various changes and modifications may be made without departing from the scope of the invention as set forth in the appended claims.

What is claimed is:

1. A semiconductor pressure sensor comprising:
   a sensor module in which a semiconductor pressure sensor part that converts a pressure to an electrical signal and a terminal of which part is extended to the outside are insert-molded with a first resin;
   an outer case in which said sensor module is further insert-molded with a second resin to form a connector portion for external connection; and
   a lid which is bonded to said outer case so as to form a pressure introduction chamber through a port for pressure introduction at an exposed space of said sensor module; wherein a groove is provided in the boundary between said sensor module and said out case in said pressure introduction chamber, and is covered with an adhesive.

2. The semiconductor pressure sensor according to claim 1, wherein an epoxy resin or a rubber of silicon resin is used as an adhesive for covering the boundary portion between said sensor module and said outer case.

3. The semiconductor pressure sensor according to claim 1, wherein a mating portion is consisted of a convex portion provided at the peripheral portion of said sensor module of said outer case and a concave portion provided at the corresponding portion of said lid, said mating portion being sealed with an epoxy adhesive.

4. The semiconductor pressure sensor according to claim 1, wherein a convex portion provided on the lid is inserted in a groove formed at the boundary portion between said sensor module and said outer case, an adhesive being put in between said convex part and groove.

5. The semiconductor pressure sensor according to claim 1, wherein said first resin is a thermosetting resin, and said second resin is a thermoplastic resin.

6. The semiconductor pressure sensor according to claim 1, wherein said terminal is formed by joining a first lead which part is insert-molded with the first resin, and a second lead of which part is a connector terminal for external electrical connection.

7. The semiconductor pressure sensor according to claim 4, wherein a gate, for use in molding said second resin, is provided on a backside of a plane through the boundary between the exposed portion of the sensor module, including a portion in which the semiconductor pressure sensor part is contained, and the second resin.

8. A die for molding a semiconductor pressure sensor, the semiconductor pressure sensor comprising:
   a semiconductor pressure sensor part that converts a pressure to an electrical signal;
   a sensor module in which said semiconductor pressure sensor part and a terminal of which part is extended to an outside area are insert-molded with a first resin; and
   an outer case in which said sensor module is contained, and said sensor module is further insert-molded with a second resin to form a connector portion of said terminal;
   wherein a portion of said sensor module is exposed by the second resin and a boundary portion between the exposed portion and the second resin is covered with an adhesive,
   wherein the portion at which said sensor module is exposed is at least a semiconductor pressure sensor mounting portion, and
   wherein a gate, for use in molding said second resin, is provided on a backside of a plane through the boundary between the exposed portion of the sensor module, including a portion in which the semiconductor pressure sensor part is contained, and the second resin.

* * * * *